United States Patent
Sarkozi et al.

(10) Patent No.: US 7,145,345 B2
(45) Date of Patent: Dec. 5, 2006

(54) CURRENT TRANSFORMERS FOR PARTIAL DISCHARGE DETECTION ON AIRCRAFT CABLES AND WIRES

(75) Inventors: Janos Gyorgy Sarkozi, Niskayuna, NY (US); Nicole Andrea Evers, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/745,141

(22) Filed: Dec. 23, 2003

(65) Prior Publication Data

US 2005/0134290 A1 Jun. 23, 2005

(51) Int. Cl.
*G01R 31/02* (2006.01)
(52) U.S. Cl. .................... 324/543; 324/536
(58) Field of Classification Search ............ 324/539, 324/541, 543, 551, 142, 536; 340/870.18
See application file for complete search history.

(56) References Cited

U.S. PATENT DOCUMENTS

| | | | | |
|---|---|---|---|---|
| 4,621,231 A | * | 11/1986 | Heinrich et al. | 324/142 |
| 5,386,193 A | * | 1/1995 | Maeda et al. | 324/547 |
| 6,067,474 A | * | 5/2000 | Schulman et al. | 607/57 |
| 6,313,640 B1 | * | 11/2001 | Nasrallah et al. | 324/536 |
| 2002/0130668 A1 | | 9/2002 | Blades | 324/536 |
| 2003/0151412 A1 | | 8/2003 | Gregory et al. | |

FOREIGN PATENT DOCUMENTS

| | | |
|---|---|---|
| JP | 57 120314 A | 7/1982 |
| JP | 60 015905 A | 1/1985 |

OTHER PUBLICATIONS

G. Guanzhong et al., "Monitoring System and Method for Wiring Systems", GE Application No. 124048; U.S. Appl. No. 10/063,603, filed May 3, 2002.

* cited by examiner

*Primary Examiner*—Vincent Q. Nguyen
(74) *Attorney, Agent, or Firm*—Fletcher Yoder

(57) ABSTRACT

A technique for detecting defects in aircraft wiring, such as for detecting partial discharges or arcing in wiring or cables is disclosed. A high frequency current transformer (HFCT) is fixingly positioned in contact with a wire so that the wire is encircled by the HFCT. Partial discharges from a damaged wire so encircled will induce a current in the HFCT proportional to the current of the discharge. The HFCT includes a conductive coil-like pattern formed onto a flexible insulating material. The insulating material has slits between each coil-turn. The HFCT also includes a core of flexible material fitted between the coil-turns through the slits.

18 Claims, 3 Drawing Sheets

CURRENT TRANSFORMERS FOR PARTIAL DISCHARGE DETECTION ON AIRCRAFT CABLES AND WIRES

GOVERNMENT INTERESTS

This invention was made with Government support under Contract No. N00014-02-C-0402 awarded by the Office of Naval Research. The Government has certain rights in this invention.

BACKGROUND OF THE INVENTION

This disclosure relates generally to systems and methods for detecting defects in aircraft wiring, and more particularly, to systems and methods for detecting partial discharges or arcing in wiring or cables.

Wiring is a critical system in aircraft, shipboard, industry and home applications. Aircraft wiring integrity and safety related issues are known to be serious and have received a great deal of interest after the Swissair 111 and TWA 800 accidents. Also, electrical fires in industry account for a large portion of property loss, and electrical fires in the home is a significant portion of the fires occurring in the home that threaten life and damage property.

Aircraft wiring insulation is much thinner than that found in building wiring in order to reduce weight. This thin insulation deteriorates with age due to changes in chemical composition, vibration during flights, large temperature changes, and exposure to agents such as dust, salt, moisture and cleaning chemicals. This wiring is also exposed to other mechanical stresses during maintenance. The aforementioned effects will degrade the insulation, causing cracks and chafing. These insulation defects can cause arcing between wires or surrounding metals. Humidity together with salt and dust depositions can make the arc creation more probable.

The detection of aircraft wiring defects is primarily performed by visual inspection by maintenance personnel. This manual inspection is a slow process and its reliability is not satisfactory. Furthermore, as it requires twisting the wiring in order to check chafing, this visual inspection often causes more problems than it can identify. Therefore, a need exists for techniques, to detect defects in wiring or cables, that can be perform by other than visual inspection and will not cause further degradation to the wire or cable under test.

Partial discharge signal detection can be used to characterize the condition of wiring. If a partial discharge occurs, the discharge will generate high frequency electrical signals traveling along the cable. This high frequency electrical signal can be detected with high frequency current transformers (HFCTs). The commercially available current transformers are typically large and heavy and can not be used for aircraft wiring monitoring as a permanently installed sensor.

BRIEF DESCRIPTION OF THE INVENTION

Partial discharge (PD) testing is a sensitive, widely used method to characterize the condition of insulation materials. The high frequency electrical signal generated by the PD activity can be detected with broadband, high frequency current transformers (HFCT). In the various embodiments of the present disclosure, current transformer designs are described suitable for retrofitting onto wires and cable bundles. Integration of several miniature current transformers into a connector, or for retrofit applications into a connector-middle piece is also described. Further embodiments may also contain preamplifiers and PD signal processing electronics.

According to an aspect of the present disclosure, a high frequency current transformer (HFCT) for detecting partial discharges produced by faulty or damaged cables and wires and a method of fabrication thereof are provided. The HFCT includes at least one conductive coil-like pattern formed onto a flexible insulating material, wherein the insulating material has slits incised between each coil-turn of the coil-like pattern. A core of a flexible material is fitted between the coil turns through said slits.

According to an additional aspect of the present disclosure, a system for detecting partial discharges produced by faulty or damaged cables and wires is provided. The system includes at least one high frequency current transformer (HFCT) configured to detect charge transfers in the range of 10 to 900 pico-Coulombs. The HFCT has a core surrounded by a coil of conducting material. Additionally, a housing dimensioned for mounting the HFCT around a wire, cable or wire-bundle and for supporting said at least one HFCT in close proximity to said wire or wire bundle and a processor in electrical communication with the HFCT, for analyzing electrical signals produced by and received from the HFCT, are provided.

According to another aspect of the present disclosure, a method for fabricating a high frequency current transformer (HFCT) for detecting partial discharges produced by faulty or damaged cables and wires. The method includes the steps of producing one or more highly conductive coil-like patterns, each pattern having a plurality of coil turns, on a flexible insulating material. The flexible insulating material is then incised between each of the plurality of coil-turns of the coil-like patterns. A flexible core material is interlaced through the incisions.

BRIEF DESCRIPTION OF THE DRAWINGS

The above and other aspects, features, and advantages of the present invention will become more apparent in light of the following detailed description when taken in conjunction with the accompanying drawings in which.

DETAILED DESCRIPTION OF THE INVENTION

Preferred embodiments of the present invention will be described hereinbelow with reference to the accompanying drawings. In the following description, well-known functions or constructions are not described in detail to avoid obscuring the invention in unnecessary detail.

The insulation condition of a wire, cable or cable bundle can be tested by partial discharge diagnostics or arcing. Electric discharges that do not completely bridge adjacent electrodes are called partial discharges (PD). The magnitude of such discharges are usually small, the amount of charge transferred is in the range of ten to a few hundred pico-Coulombs, e.g., 10–900 pC. For a partial discharge test, a suitably high AC or DC voltage is applied to conductors surrounding the insulation material under test. Alternatively, the discharge can be detected under normal current/voltage operating conditions depending on the defect and energized system characteristics. If partial discharge occurs, the discharge will generate high frequency electrical signals traveling along the cable. This high frequency electrical signal can be detected with high frequency current transformers (HFCTs).

Figure 1:
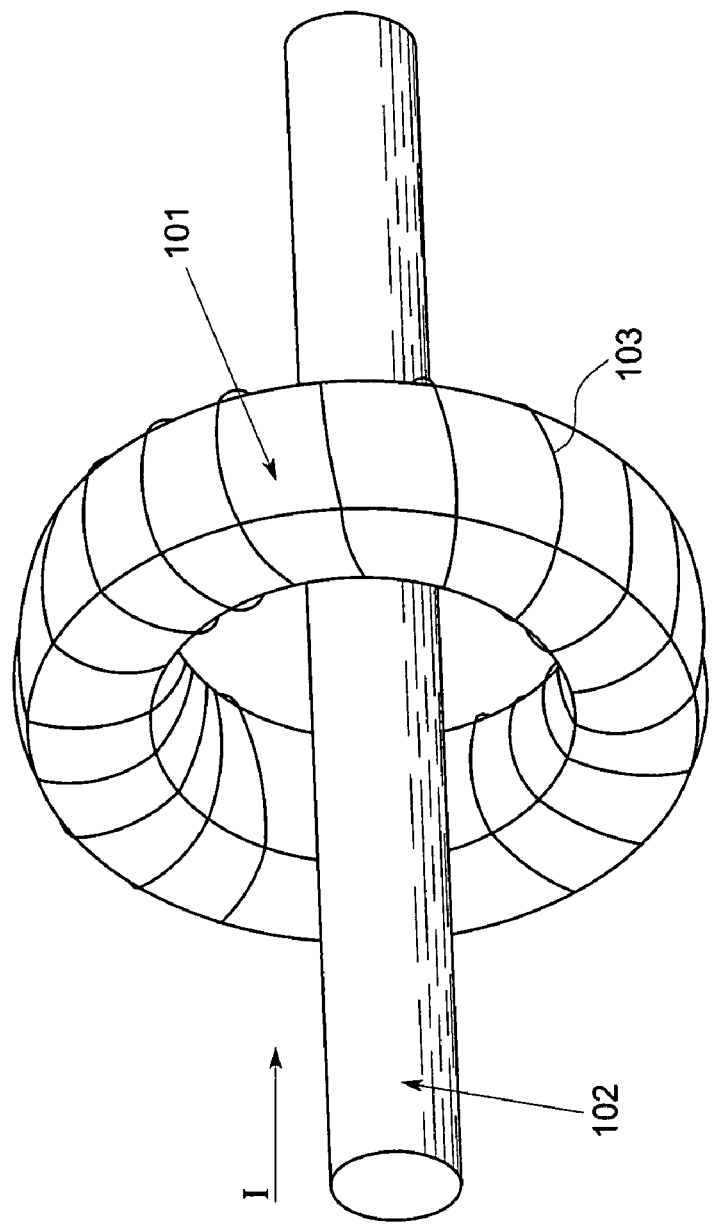
FIG. 1 illustrates an embodiment of a prior art current transformer.

The basic principle for current transformer based AC current measurement is illustrated in FIG. 1. Current transformers can be used to non-intrusively measure the high frequency current in isolated wires 102. A cylindrical magnetic core 101 surrounds the wire 102. The magnetic core 101 can be a high permeability material suitable for high frequencies, or it can be non-magnetic, e.g. an air core such as a Rogowsky coil. A wire coil 103 is wound around the cylindrical magnetic core 101.

The alternating current (I) in the wire 102 will induce an alternating magnetic field in the magnetic core 101. This magnetic field in the core 101 will induce voltage in the coil 103, which is proportional to the current (I) in the wire 102.

A current signal generated by a partial discharge can be detected with a single HFCT around the cable bundle, or similarly, a smaller size HFCT can be used around a single wire. The current sensor of the present disclosure, preferably, has a flat design, so as not to significantly increase the diameter of the wire. Additionally, the HFCT is constructed in a manner suitable for installation and/or clamping onto a wire, cable or wire bundle to allow installation onto assembled cable harnesses, or alternatively, can be installed and fixed onto wires, wherein both wire ends have already been connected.

Figure 2:
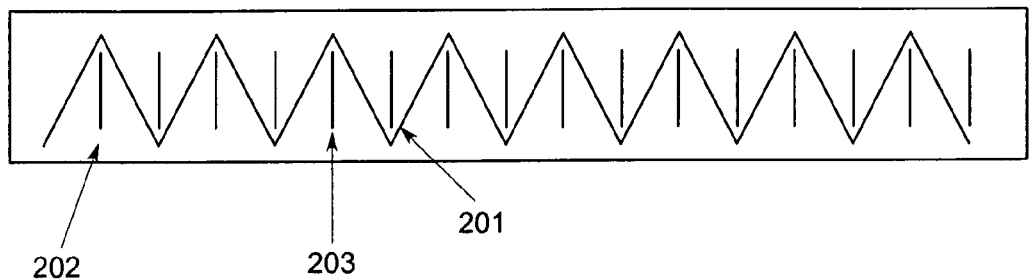
FIG. 2 illustrates an embodiment of a high frequency current transformer (HFCT) for monitoring defects in a wire in an intermediate phase of fabrication.
Figure 3:
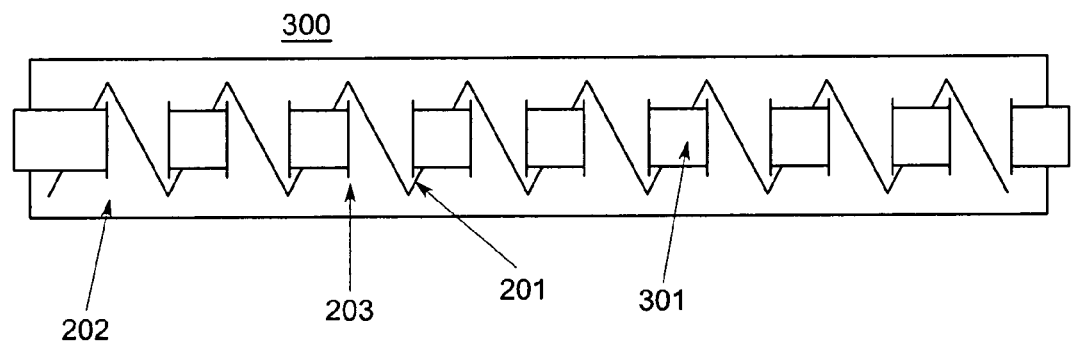
FIG. 3 illustrates a completed fabrication of the embodiment of an HFCT for monitoring defects in a wire as shown in FIG. 2.

Referring to FIG. 2, a flat, flexible current transformer is fabricated by forming coil-like patterns 201 onto a film 202. The film 202 is preferably made of an insulator material, e.g., Kapton, and the pattern 201 is accomplished by applying a highly conductive strip, preferably of metallic materials such as copper, aluminum or gold, in the desired coil pattern using methods of deposition commonly known in the art. The coil-like pattern 201 is an example only and several other patterns can be used to form the coil. To form the coil and core arrangement, the film 202 is incised within the "coil turns" 203 and a flat, flexible magnetic core strip 301 is installed as illustrated in FIG. 3.

For proper functioning of the HFCT 300, the magnetic core 301 is configured to form a closed cylinder. The wire coil 201, however, is not required to form a completely closed cylinder, though the optimal form is a closed cylinder.

Preferably, the core material 301 is a flexible, thin, high permeability material, useable for frequencies up to 500 MHz or even higher. Materials such as Cobalt-based amorphous metal and Ferrite Polymer Composite (FPC) Films may be used, as well as, cores with unity permeability, such as plastic. Several layers can be stacked to achieve the desired core size but still retain the flexibility. Overlapping the ends of the core layer during installation will close the magnetic path. Additionally, the core may be an air core, e.g., a Rogowsky coil.

Figure 4:
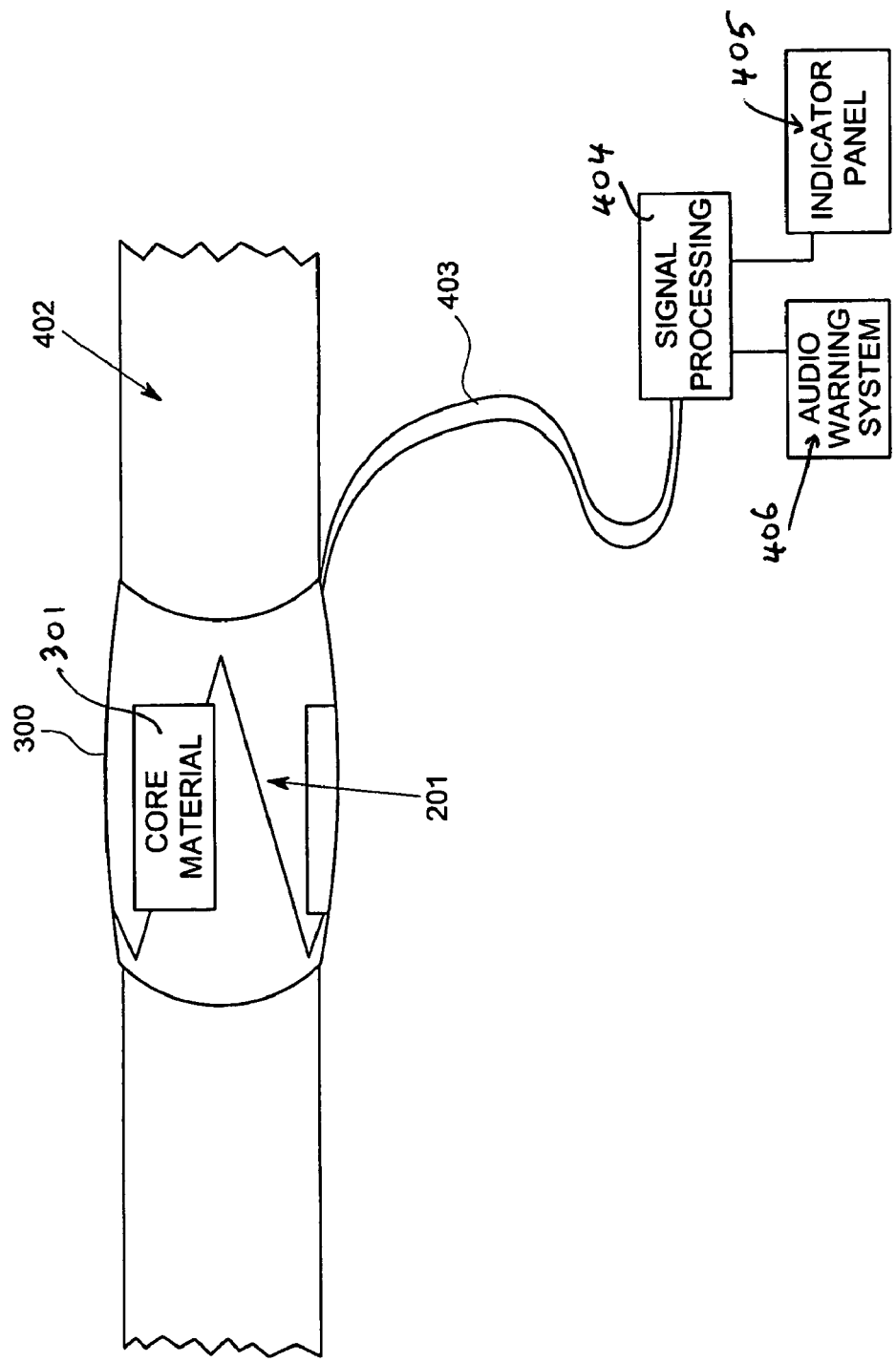
FIG. 4 illustrates the HFCT of FIG. 3 installed on a wire under test.

FIG. 4 illustrates a HFCT 300 in use wrapped around a wire 402. A signal generated by a partial discharge is relayed via wire leads 403 to a signal processing system 404 wherein the signal is analyzed for determination of the existence and severity of a wiring defect based on criteria including signal waveform and amplitude. The analysis results may be displayed visually on an indicator panel 405, using LEDs of various colors (conventionally: green for functioning, yellow for warning and red for critical) or on a display screen (not shown). Additionally, an audio warning system 406 may be triggered when the severity of the defect surpasses a predefined threshold. The control of the indicator panel 405 and audio warning system 406, as well as the functions of the signal processing system 404 may be integrated into any suitable computer platform.

The HFCT 300 may be embedded into a plastic structure. This plastic structure can serve as a mechanical protection and may have a self-locking whole-pin arrangement at the sides for fixing the structure onto the wire. The HFCT 300 can also be pre-formed and tightened onto a wire with a shrink-tube outer cover or other technique.

Additionally, a preamplifier or other signal processing chips/circuitry can be directly mounted onto the HFCT 300 itself. The additional circuitry can provide some or all of the functionality of the remote signal processing system 404, thus, providing a signal amplification and/or analysis in a self-contained and compact device. Further, circuitry for wireless communications, utilizing standard protocols such as bluetooth or 802.11a/b/g, can be included, eliminating the need for providing leads 403 to transmit the signals to a central processor or display.

The HFCT can be shielded by applying a conductive shield around the HFCT to reduce noise generated from surrounding electrical components. Additionally, capacitive voltage sensors can be used as a secondary method of partial discharge detection which, when used in conjunction with the current transformer, can provide a means of further reducing signal noise by comparing results from both sensors.

In an alternate embodiment, the conductive coil 201 can be directly deposited to the core material 301. If the core 301 is conductive, a suitable insulation layer will be provided to be used under the coil material 301.

Figure 5:
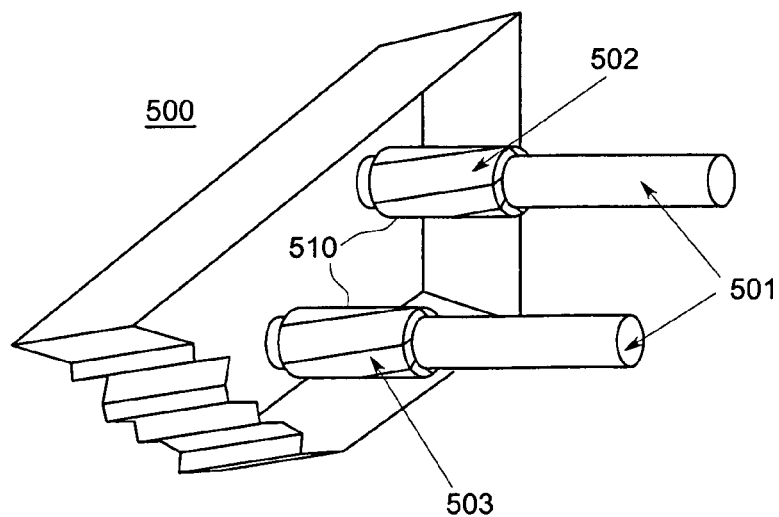
FIG. 5 illustrates another embodiment of a HFCT for monitoring defects in a wire configured to be installable onto connector pins.

Additionally, a HFCT may be integrated to a connector 500 (see FIG. 5). In this embodiment, each connector pin 501 is surrounded by an HFCT 510, which can be accomplished using a hollow ferrite bead 502 wrapped with a coil 503. Alternately, a coil-shaped conductive film strips can also be formed directly on the ferrite bead 502, with suitable insulation layer under the film. Partial discharges are detected by the HFCT 510, wherein a current is induced in the coil 503 which may be transmitted to a processing unit for determination of magnitude of the insulation damage and determine possible remedies, i.e. shunting power to backup systems, provide visual indications to operators or service personnel and an audible alarm.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A high frequency current transformer (HFCT) for detecting partial discharges produced by faulty or damaged cables and wires, said HFCT comprising:
   at least one conductive coil-like pattern formed onto a flexible insulating material, said insulating material having slits between each coil-turn of the coil-like pattern; and
   a core of flexible material fitted between the coil-turns through said slits while permitting said flexible insulating material to remain substantially flat to form a flat flexible current transformer, said core enhancing and directing flux induced in the coil-like pattern.

2. The HFCT of claim 1, wherein said HFCT is configured for detecting partial discharges in the range of 10 to 900 pico-Coulombs.

3. The HFCT of claim 1, wherein said core is a magnetic material with a high permeability suitable for use with high frequency electrical signals.

4. The HFCT of claim 3, wherein said magnetic material is a cobalt-based amorphous metal or a ferrite polymer composite.

5. The HFCT of claim 1, wherein said core is a non-magnetic material suitable for use with high frequency electrical signals.

6. The HFCT of claim 1, further comprising a means for fixingly mounting said HFCT to a cable, wire, or wire bundle.

7. The HFCT of claim 1, wherein the insulating material is a film.

8. A system for detecting partial discharges produced by faulty or damaged cables and wires, the system comprising:
   at least one high frequency current transformer (HFCT) comprising at least one conductive coil-like pattern formed onto a flexible insulating material, said insulating material having slits between each coil-turn of the coil-like pattern; and a core of flexible material fitted between the coil-turns through said slits, said core enhancing and directing flux induced in the coil-like pattern;
   a housing dimensioned for mounting said at least one HFCT around a wire or wire-bundle and for supporting said at least one HFCT in close proximity to said wire or wire bundle; and
   a processor in electrical communication with said at least one HFCT, said processor configured for analyzing electrical signals produced by, and received from said at least one HFCT.

9. The system of claim 8, wherein said HFCT is configured for detecting partial discharges in the range of 10 to 900 pico-Coulombs.

10. The system of claim 8, wherein said core is either a magnetic material having high permeability suitable for use with high frequency electrical signals, or a non-magnetic core, said core forming a cylindrical, toroidal shape around said wire or wire-bundle and oriented parallel to the central axis of the core.

11. The system of claim 8, wherein said core is an air core forming a cylindrical, toroidal shape wherein said wire or wire-bundle is positioned at the center and oriented parallel to the central axis of the core.

12. The system of claim 8, further comprising a status indicator controlled by said processor for indicating a status of a monitored wire or wire bundle.

13. The system of claim 12, wherein said status is selected from a group consisting of: Critical, Warning and Functioning.

14. A method for fabricating a high frequency current transformer (HFCT) for detecting partial discharges produced by faulty or damaged cables and wires, said method comprising the steps of:
   producing one or more highly conductive coil-like patterns, each pattern having a plurality of coil turns, on a flexible insulating material;
   incising said flexible insulating material between each of the plurality of coil-turns of the coil-like patterns; and
   interlacing a flexible core material through said incisions while permitting said flexible insulating material to remain substantially flat to form a flat flexible current transformer, said flexible core material enhancing and directing flux induced in the coil-like patterns.

15. The method of claim 14, wherein said core is a magnetic material with a high permeability suitable for use with high frequency electrical signals.

16. The method of claim 14, wherein said magnetic material is a cobalt-based amorphous metal or a ferrite polymer composite.

17. The method of claim 14, wherein said core is a non-magnetic material suitable for use with high frequency electrical signals.

18. The method of claim 14, wherein the insulating material is a film.

* * * * *